United States Patent
Tsai et al.

(10) Patent No.: US 12,041,784 B2
(45) Date of Patent: Jul. 16, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Shih-Hung Tsai, Tainan (TW); Hon-Huei Liu, Kaohsiung (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 50 days.

(21) Appl. No.: 17/491,509

(22) Filed: Sep. 30, 2021

(65) Prior Publication Data

US 2023/0066509 A1     Mar. 2, 2023

(30) Foreign Application Priority Data

Aug. 27, 2021   (CN) .......................... 202110993723.6

(51) Int. Cl.
| H10B 53/30 | (2023.01) |
| H01L 27/12 | (2006.01) |
| H01L 27/13 | (2006.01) |
| H10B 51/00 | (2023.01) |

(52) U.S. Cl.
CPC ......... *H10B 53/30* (2023.02); *H01L 27/1207* (2013.01); *H01L 27/13* (2013.01)

(58) Field of Classification Search
CPC ........... H01L 27/11507; H01L 27/1207; H01L 27/13; H01L 27/1159; H01L 29/78391; H01L 29/516; H01L 29/6684
See application file for complete search history.

(56) References Cited

U.S. PATENT DOCUMENTS

| 5,303,182 A * | 4/1994 | Nakao ................. H01L 29/6684 |
| | | 257/295 |
| 5,330,931 A * | 7/1994 | Emesh .................... H01L 28/55 |
| | | 257/E27.104 |
| 5,374,578 A * | 12/1994 | Patel ....................... H01L 28/55 |
| | | 257/E27.104 |
| 6,562,678 B1 * | 5/2003 | Uchiyama ................ C23C 16/44 |
| | | 438/763 |
| 9,660,107 B1 * | 5/2017 | Colinge ............. G11C 14/0018 |
| 9,991,171 B1 * | 6/2018 | Zhou ....................... H01L 29/516 |
| 10,403,815 B2 | 9/2019 | Ino |

(Continued)

FOREIGN PATENT DOCUMENTS

CN          100550391        10/2009

OTHER PUBLICATIONS

Chen, the specification, including the claims, and drawings in the U.S. Appl. No. 15/206,319, Filing Date: Jul. 11, 2016.

*Primary Examiner* — Suberr L Chi
(74) *Attorney, Agent, or Firm* — Winston Hsu (57) ABSTRACT

A method for fabricating a semiconductor device includes the steps of forming a metal-oxide semiconductor (MOS) transistor on a substrate, forming an interlayer dielectric (ILD) layer on the MOS transistor, forming a ferroelectric field effect transistor (FeFET) on the ILD layer, and forming a ferroelectric random access memory (FeRAM) on the ILD layer. The formation of the FeFET further includes first forming a semiconductor layer on the ILD layer, forming a gate structure on the semiconductor layer, and then forming a source/drain region adjacent to the gate structure.

5 Claims, 6 Drawing Sheets

(56) References Cited

U.S. PATENT DOCUMENTS

| | | | |
|---|---|---|---|
| 2001/0012698 A1* | 8/2001 | Hayashi | H01L 21/31691 |
| | | | 438/758 |
| 2004/0061153 A1* | 4/2004 | Misewich | H10B 51/00 |
| | | | 257/295 |
| 2005/0110063 A1* | 5/2005 | Huang | H10B 12/30 |
| | | | 257/296 |
| 2006/0022240 A1* | 2/2006 | Huang | H10B 12/03 |
| | | | 257/E21.654 |
| 2013/0187150 A1* | 7/2013 | Yamazaki | H01L 29/78696 |
| | | | 257/43 |
| 2016/0225772 A1* | 8/2016 | Tsubuku | H01L 29/78621 |
| 2018/0006129 A1* | 1/2018 | Xing | H01L 29/6684 |
| 2018/0182860 A1* | 6/2018 | Lee | H01L 21/823842 |
| 2018/0226417 A1* | 8/2018 | Ando | H01L 27/092 |
| 2019/0067488 A1* | 2/2019 | Tsai | H01L 29/66545 |
| 2019/0280694 A1* | 9/2019 | Obradovic | G11C 11/223 |
| 2020/0006359 A1* | 1/2020 | Wu | H01L 29/0657 |
| 2020/0176457 A1* | 6/2020 | Sharma | H10B 51/40 |
| 2021/0035993 A1* | 2/2021 | Chen | H01L 28/56 |
| 2021/0242225 A1* | 8/2021 | Manfrini | H10B 53/00 |
| 2021/0391470 A1* | 12/2021 | Manfrini | H01L 29/516 |
| 2021/0398992 A1* | 12/2021 | Wu | H01L 27/11502 |
| 2021/0408042 A1* | 12/2021 | Lin | H01L 27/11597 |
| 2022/0344359 A1* | 10/2022 | Ali | H01L 29/513 |

* cited by examiner

SEMICONDUCTOR DEVICE AND METHOD FOR FABRICATING THE SAME

BACKGROUND OF THE INVENTION

1. Field of the Invention

The invention relates to a method of fabricating a semiconductor device, and more particularly to a method of integrating a ferroelectric field effect transistor (FeFET) and a ferroelectric random access memory (FeRAM).

2. Description of the Prior Art

In efforts to improve memory arrays, field effect transistors with ferroelectric gates or ferroelectric field effect transistors (FeFETs) have been recently in the focus of research. In general, ferroelectric materials have dielectric crystals which show a spontaneous electric polarization similar to ferromagnetic materials showing a spontaneous magnetization. Upon applying an appropriate external electric field to a ferroelectric material, the direction of polarization can be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter-oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically-switchable data storage devices.

On the basis of ferroelectric materials, it is possible to provide non-volatile memory devices, particularly random-access memory devices similar in construction to DRAM devices, but differing in using a ferroelectric layer instead of a dielectric layer such that non-volatility is achieved. For example, the 1T-1C storage cell design in a FeRAM is similar in construction to the storage cell in widely used DRAM in that both cell types include one capacitor and one access transistor—a linear dielectric is used in a DRAM cell capacitor, whereas, in a FeRAM cell capacitor, the dielectric structure includes a ferroelectric material. Other types of FeRAMs are realized as 1T storage cells which consist of a single FeFET employing a ferroelectric dielectric instead of the gate dielectric of common MOSFETs. The current-voltage characteristic between source and drain of a FeFET depends in general on the electric polarization of the ferroelectric dielectric, i.e., the FeFET is in the on- or off-state, depending on the orientation of the electric polarization state of the ferroelectric dielectric. Writing of a FeFET is achieved in applying a writing voltage to the gate relative to source, while a 1T-FeRAM is read out by measuring the current upon applying a voltage to source and drain. It is noted that reading out of a 1T-FeRAM is non-destructive.

A means of optimizing FeFETs and FeRAMs is to minimize the sizes of these elements, however, the complexity and cost for integrating and reducing the size of these elements also increases accordingly. Hence, how to lower cost while keeping performance of the device has become an important task in this field.

SUMMARY OF THE INVENTION

A method for fabricating a semiconductor device includes the steps of forming a metal-oxide semiconductor (MOS) transistor on a substrate, forming an interlayer dielectric (ILD) layer on the MOS transistor, forming a ferroelectric field effect transistor (FeFET) on the ILD layer, and forming a ferroelectric random access memory (FeRAM) on the ILD layer. The formation of the FeFET further includes first forming a semiconductor layer on the ILD layer, forming a gate structure on the semiconductor layer, and then forming a source/drain region adjacent to the gate structure.

According to another aspect of the present invention, a semiconductor device includes a metal-oxide semiconductor (MOS) transistor on a substrate, an interlayer dielectric (ILD) layer on the MOS transistor, a ferroelectric field effect transistor (FeFET) on the ILD layer, an inter-metal dielectric (IMD) layer on the FeFET and the ILD layer, and a ferroelectric random access memory (FeRAM) on the IMD layer.

According to yet another aspect of the present invention, a semiconductor device includes a metal-oxide semiconductor (MOS) transistor on a substrate, an interlayer dielectric (ILD) layer on the MOS transistor, a ferroelectric field effect transistor (FeFET) on the ILD layer, a ferroelectric random access memory (FeRAM) on the ILD layer, and an inter-metal dielectric (IMD) layer on the FeFET and the FeRAM.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
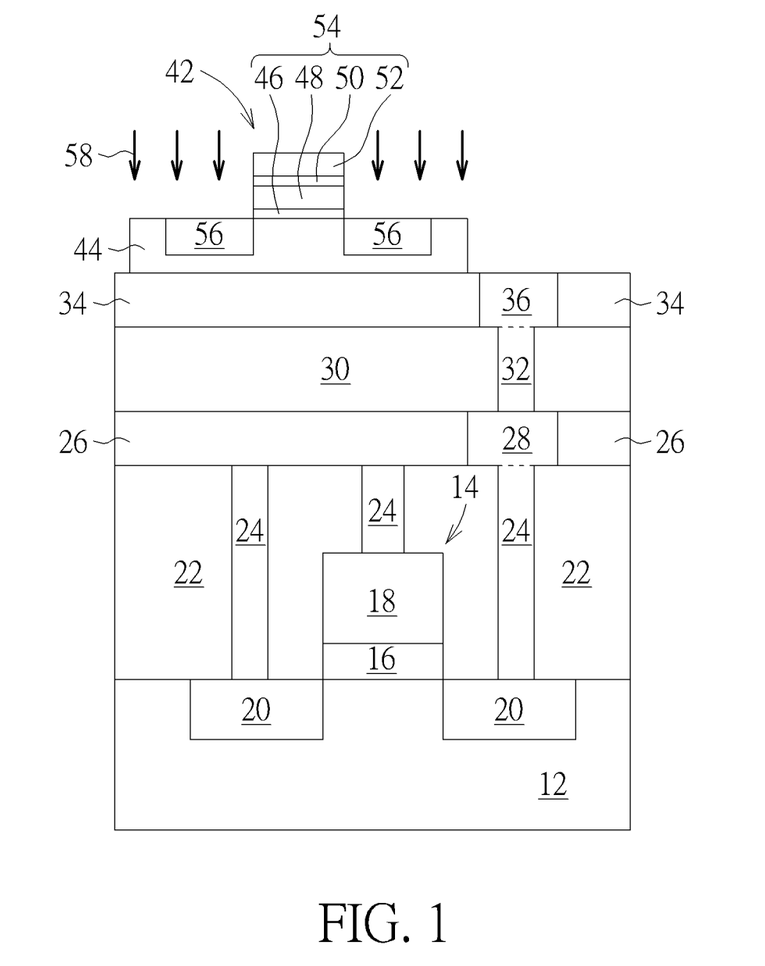
FIGS. 1-3 illustrate a method for fabricating a semiconductor device according to an embodiment of the present invention.
Figure 2:
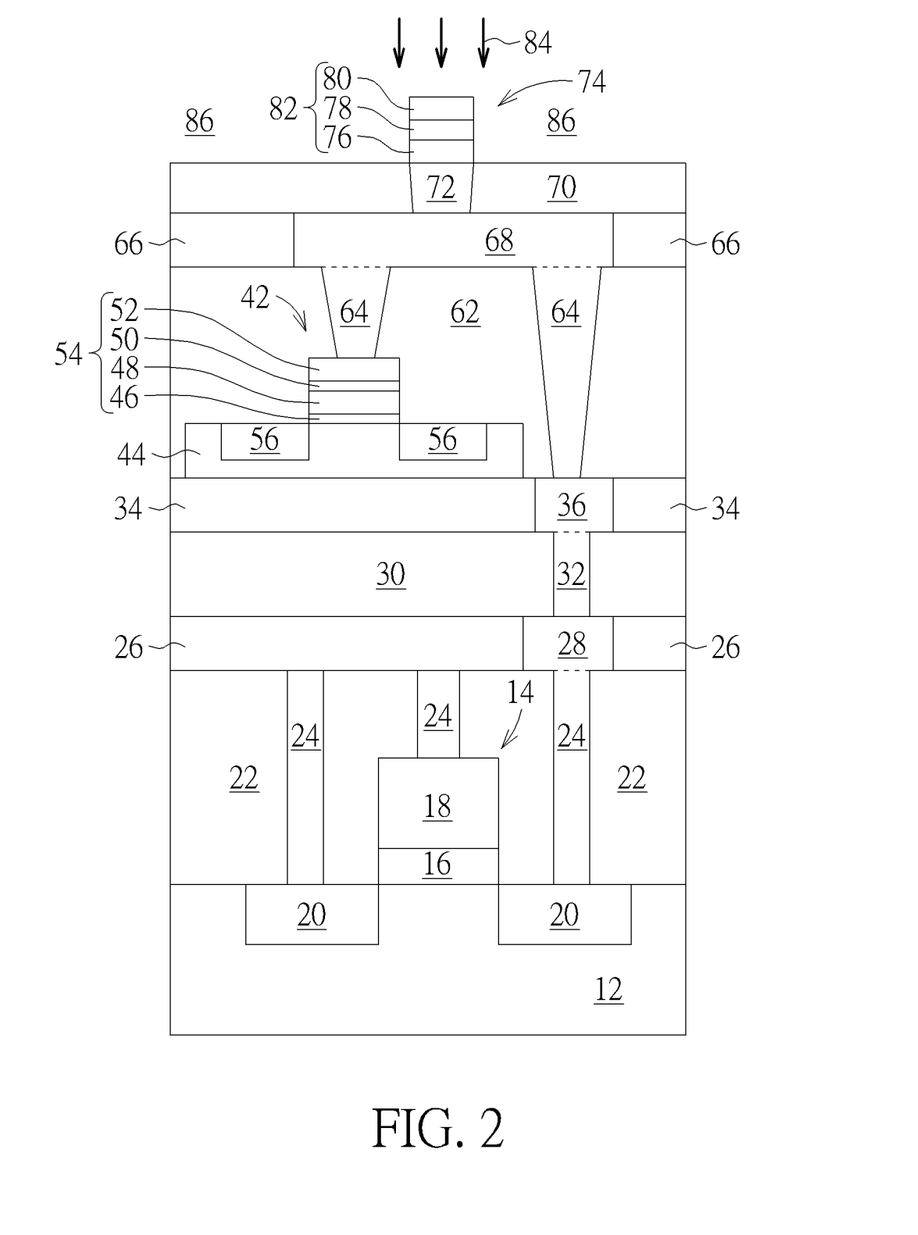
Figure 3:
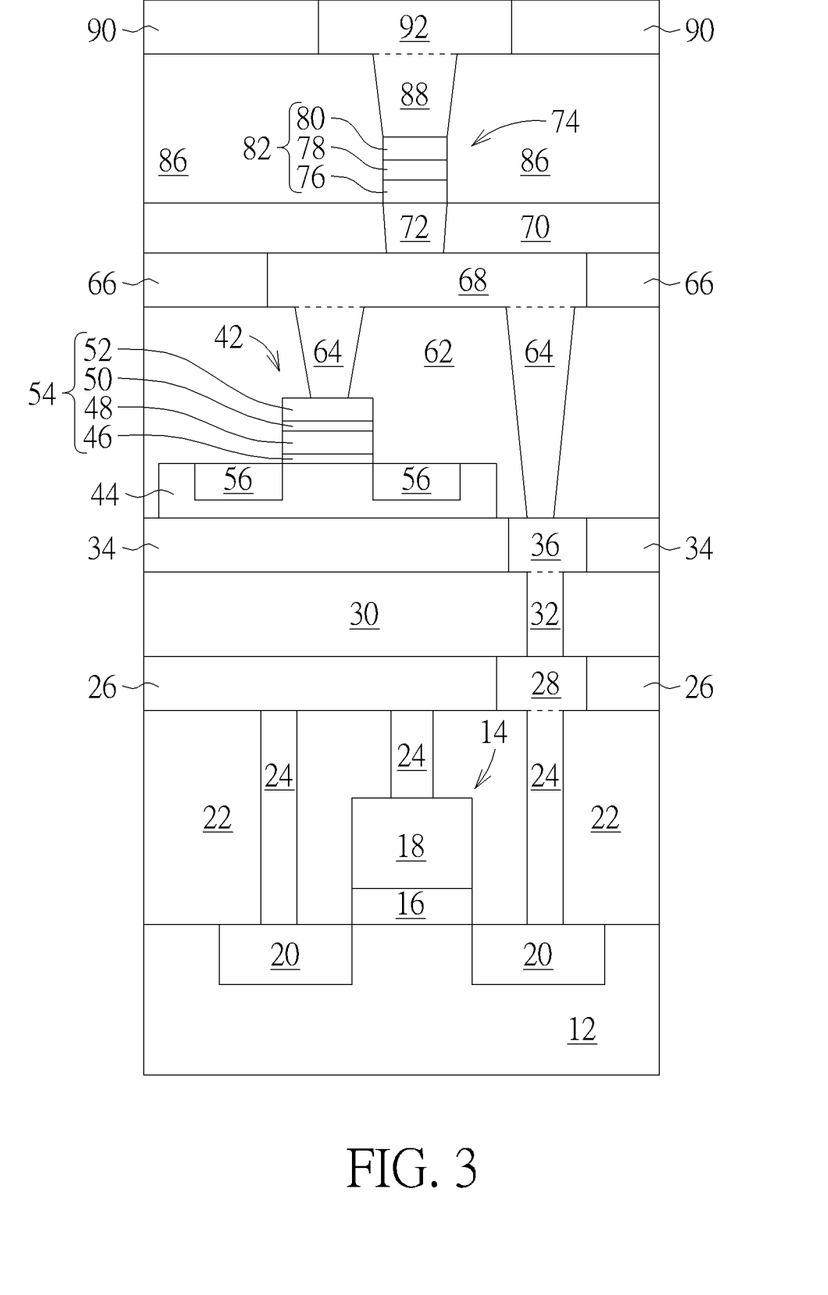

Referring to FIGS. 1-3, FIGS. 1-3 illustrate a method for fabricating a semiconductor device or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). Active devices such as metal-oxide semiconductor (MOS) transistors, passive devices, conductive layers, and interlayer dielectric (ILD) layer could also be formed on top of the substrate 12. More specifically, at least a planar MOS transistor or non-planar (such as FinFETs) MOS transistors could be formed on the substrate 12, in which the MOS transistors could include transistor elements such as a gate dielectric layer 16, a gate electrode (such as metal gate) 18, source/drain regions 20, spacers, epitaxial layers, and a contact etch stop layer (CESL). An ILD layer 22 could be formed on the substrate 12 to cover the MOS transistors, and a plurality of contact plugs 24 could be formed in the ILD layer 22 to electrically connect to the gate electrodes 18 and/or source/drain region 20 of MOS transistors. Since the fabrication of planar or non-planar transistors and ILD layer is well known to those skilled in the art, the details of which are not explained herein for the sake of brevity.

Next, at least a metal interconnect structure is formed on the ILD layer 22 to electrically connect the contact plugs 24, in which the metal interconnect structure could include an inter-metal dielectric (IMD) layer 26 disposed on the ILD layer 22, at least a metal interconnection 28 embedded in the IMD layer 26, an IMD layer 30 disposed on the IMD layer 26, at least a metal interconnection 32 such as via conductor embedded in the IMD layer 30, an IMD layer 34 disposed on the IMD layer 30, and at least a metal interconnection 36 embedded in the IMD layer 34. Preferably, the metal interconnection 28 made of trench conductor could be referred as a first level metal interconnection and the metal interconnection 36 also made of trench conductor could be referred to as a second level metal interconnection.

Preferably, each of the metal interconnections 28, 32, 36 could be embedded within the IMD layers 26, 30, 34 according to a single damascene process or dual damascene process. For instance, each of the metal interconnections 28, 32, 36 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. Moreover, the metal layer within the metal interconnections 28, 32, 36 preferably includes copper and the IMD layers 26, 30, 34 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH).

Next, a FeFET 42 is formed on the ILD layer 22 or IMD layer 34. In this embodiment, the formation of the FeFET 42 could be accomplished by first forming a semiconductor layer 44 on the surface of the IMD layer 34, performing an anneal process such as a nanosecond laser anneal (NS-LSA) process on the semiconductor layer 44, and then conducting a photo-etching process to remove part of the semiconductor layer 44 for forming a patterned semiconductor layer 44 on the surface of the IMD layer 34. Next, an interfacial layer 46, a bottom electrode 48, a ferroelectric (FE) layer 50, and a top electrode 52 are formed on the semiconductor layer 44, and a photo-etching process is conducted to remove part of the top electrode 52, part of the FE layer 50, part of the bottom electrode 48, and part of the interfacial layer 46 to form a gate structure 54 made of a patterned interfacial layer 46, a patterned bottom electrode 48, a patterned FE layer 50, and a patterned top electrode 52 on the semiconductor layer 44.

In this embodiment, the semiconductor layer 44 could be selected from the group consisting of silicon (Si), germanium (Ge), Si—Ge compounds, silicon carbide (SiC), and gallium arsenide (GaAs), the interfacial layer 46 includes silicon oxide, and the bottom electrode 48 and top electrode 52 are made of conductive material such as titanium nitride (TiN). The FE layer 50 preferably includes $HfZrO_2$, nevertheless, according to other embodiments of the present invention, the FE layer 50 could also include a material selected from the group consisting of lead zirconate titanate ($bZrTiO_3$, PZT), lead lanthanum zirconate titanate (PbLa$(TiZr)O_3$, PLZT), strontium bismuth tantalate ($SrBiTa_2O_9$, SBT), bismuth lanthanum titanate (($BiLa)_4Ti_3O_{12}$, BLT), and barium strontium titanate ($BaSrTiO_3$, BST). Moreover, the interfacial layer 46 includes a thickness of approximately 7 Angstroms, the bottom electrode 48 includes a thickness of approximately 100 Angstroms, the FE layer 50 includes a thickness of approximately 20-50 Angstroms, and the top electrode 52 includes a thickness of approximately 100 Angstroms.

Next, at least a spacer (not shown) is formed on sidewalls of the gate structure 54, a source/drain region 56 and/or epitaxial layer (not shown) are formed in the semiconductor layer 44 adjacent to two sides of the spacer, and selective silicides (not shown) could be formed on the surface of the source/drain region 56 and/or epitaxial layer. In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain region 56 could include n-type dopants or p-type dopants depending on the type of device being fabricated and the epitaxial layers could include silicon germanium (SiGe), silicon carbide (SiC), or silicon phosphide (SiP).

Next, an anneal process 58 such as an ultra-fast laser anneal (UF-LSA) process is conducted on the FE layer 50 of the FeFET 42 for a phase change. Preferably, the anneal process 58 is conducted at a temperature greater than 500° C. and a duration of the anneal process 58 is less than 15 picoseconds.

Next, as shown in FIG. 2, an IMD layer 62 is formed on the FeFET 42, metal interconnections 64 such as via conductors are formed in the IMD layer 62 to electrically connect the FeFET 42 and the metal interconnection 36, an IMD layer 66 is formed on the IMD layer 62, at least a metal interconnection 68 is formed in the IMD layer 66, an IMD layer 70 is formed on the IMD layer 66, and at least a metal interconnection 72 is formed in the IMD layer 70. Preferably, the metal interconnections 64 made of via conductors could also be referred to as third level metal interconnection or third level via conductors and the metal interconnection 68 made of trench conductor could be referred to as fourth level metal interconnection. Similar to the aforementioned embodiment, each of the metal interconnections 64, 68, 72 could be interconnected to each other and embedded within the IMD layers 62, 66, 70 according to a single damascene process or dual damascene process. Moreover, the metal interconnections 64, 68 preferably include copper, the metal interconnection 72 preferably includes tungsten, and the IMD layers 62, 66, 70 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH).

Next, a FeRAM 74 is formed on the IMD layer 70. In this embodiment, the formation of the FeRAM 74 could be accomplished by first forming a bottom electrode 76, a FE layer 78, and a top electrode 80 on the IMD layer 70 and the metal interconnection 72, and then conducting a photo-etching process to remove part of the top electrode 80, part of the FE layer 78, and part of the bottom electrode 76 to form a stack structure 82 made of a patterned bottom electrode 76, a patterned FE layer 78, and a patterned top electrode 80 on the metal interconnection 72.

Similar to the aforementioned embodiment, the bottom electrode 76 and the top electrode 80 are made of conductive material such as titanium nitride (TiN). The FE layer 78 preferably includes $HfZrO_2$, nevertheless, according to other embodiments of the present invention, the FE layer 78 could also include a material selected from the group consisting of lead zirconate titanate ($bZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate ($(BiLa)_4Ti_3O_{12}$, BLT), and barium strontium titanate ($BaSrTiO_3$, BST).

Moreover, in this embodiment, the bottom electrode 76 includes a thickness of about 100 Angstroms, the FE layer 78 includes a thickness between 100-120 Angstroms or most preferably at 110 Angstroms, and the top electrode 80 includes a thickness of about 100 Angstroms. It should be noted that the thicknesses of the bottom electrode 76 and top electrode 80 of the FeRAM 74 are substantially equal to the thicknesses of the bottom electrode 48 and top electrode 52 of the aforementioned FeFET 42. For instance, the thickness of each of the four elements is about 100 Angstroms. Nevertheless, the thickness of the FE layer 50 of the FeFET 42 is substantially less than the thickness of the FE layer 78 from the FeRAM 74. According to a preferred embodiment of the present invention, the thickness of the FE layer 78 formed at this stage is about two times or more than the thickness of the FE layer 50. For instance, the thickness of the FE layer 78 could be two times, three times, four times, or more than the thickness of the FE layer 50.

Next, an anneal process 84 such as a rapid thermal anneal (RTP) process could be conducted on the FE layer 78 of the FeRAM 74 for phase change. Preferably, the anneal process 84 is conducted at a temperature equal to or less than 400° C. and a duration of the anneal process 84 is between 25-35 seconds or most preferably at 30 seconds.

Next, as shown in FIG. 3, an IMD layer 86 is formed on the FeRAM 74, at least a metal interconnection 88 such as a via conductor is formed in the IMD layer 86 to electrically connect the top electrode 80 in the FeRAM 74, an IMD layer 90 is formed on the IMD layer 86, and at least a metal interconnection 92 is formed in the IMD layer 90. Preferably, the metal interconnections 88 made of via conductors could also be referred to as fifth level metal interconnection or fifth level via conductor and the metal interconnection 92 made of trench conductor could be referred to as sixth level metal interconnection. Similar to the aforementioned embodiment, each of the metal interconnections 88, 92 could be interconnected to each other and embedded within the IMD layers 86, 90 according to a single damascene process or dual damascene process. Moreover, the metal interconnections 88, 92 preferably include copper and the IMD layers 86, 90 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH). This completes the fabrication of a semiconductor device according to an embodiment of the present invention.

Figure 4:
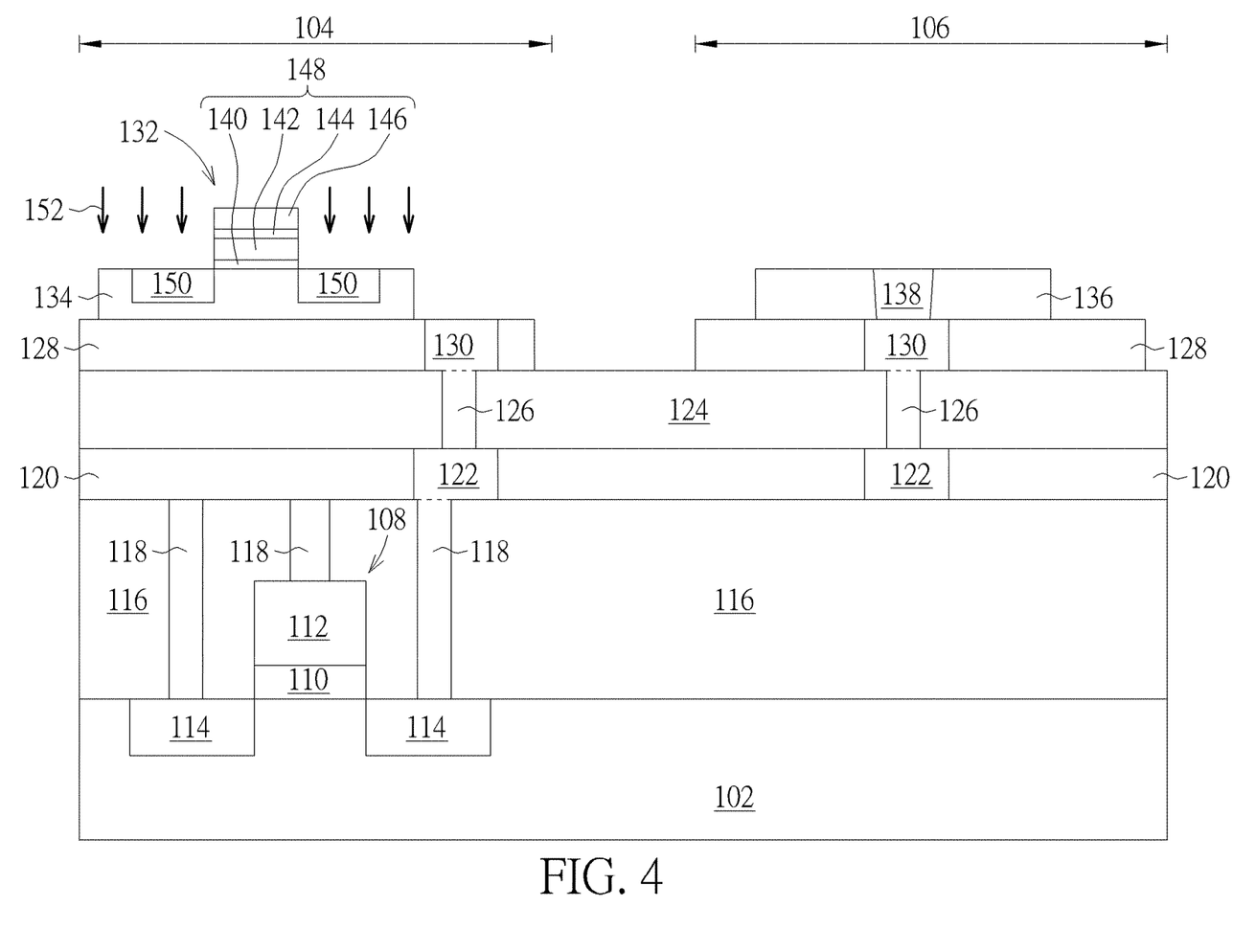
FIGS. 4-6 illustrate a method for fabricating a semiconductor device according to an embodiment of the present invention.
Figure 5:
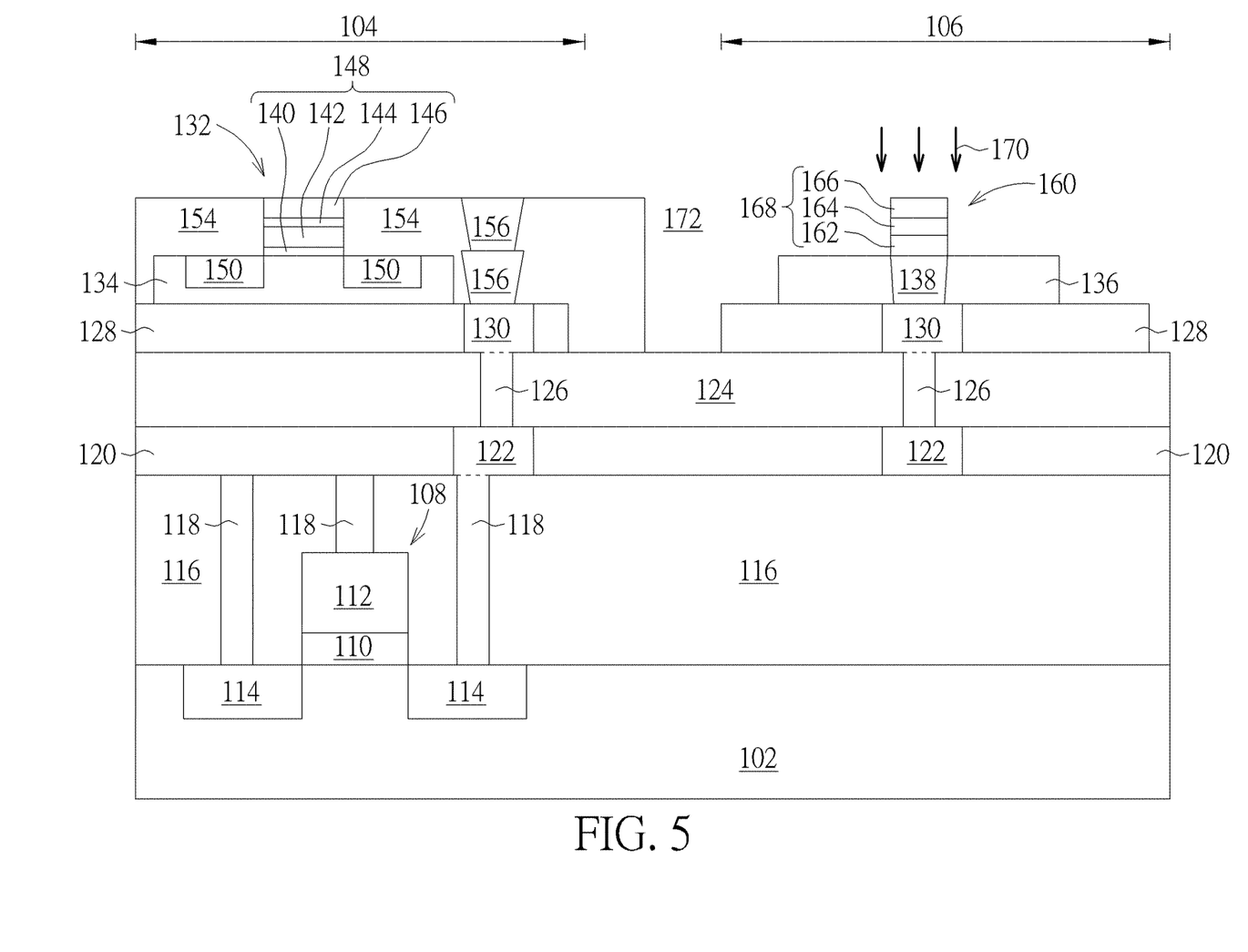
Figure 6:
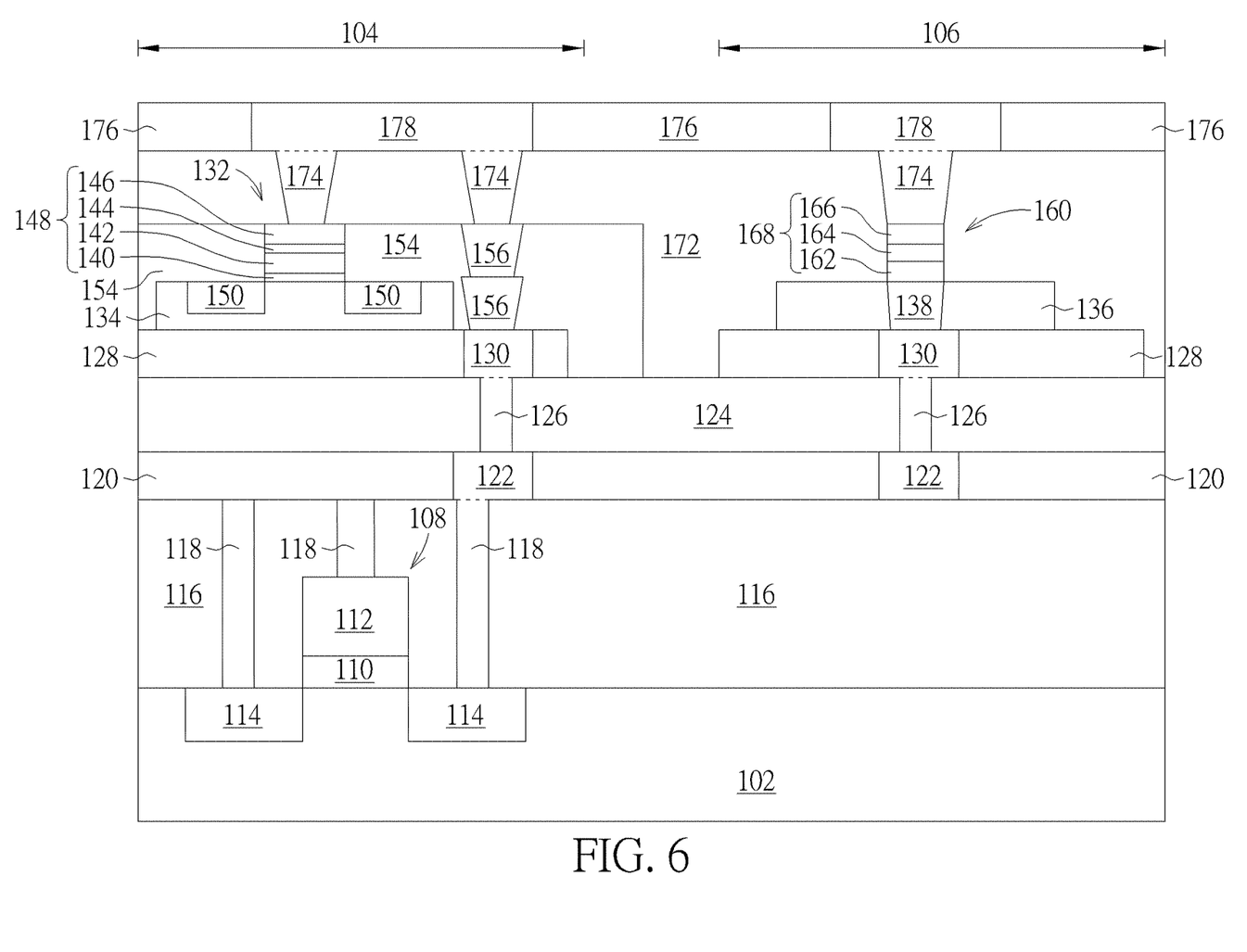

Referring to FIGS. 4-6, FIGS. 4-6 illustrate a method for fabricating a semiconductor device or more specifically a MRAM device according to an embodiment of the present invention. As shown in FIG. 4, a substrate 102 made of semiconductor material is first provided, in which the semiconductor material could be selected from the group consisting of silicon (Si), germanium (Ge), Si—Ge compounds, silicon carbide (SiC), and gallium arsenide (GaAs). A first region 104 and a second region 106 are defined on the substrate 102, in which elements such as metal-oxide semiconductor (MOS) transistor and FeFET will be formed on the first region 104 on the later process while element such as FeRAM will be formed on the second region 106.

Similar to the aforementioned embodiment, active devices such as metal-oxide semiconductor (MOS) transistors, passive devices, conductive layers, and an interlayer dielectric (ILD) layer 116 could also be formed on top of the substrate 102. More specifically, at least a planar MOS transistor or non-planar (such as FinFETs) MOS transistor could be formed on the first region 104 of the substrate 102, in which the MOS transistor 108 could include transistor elements such as a gate dielectric layer 110, a gate electrode 112 such as a metal gate, a source/drain region 114, spacers, epitaxial layers, and a contact etch stop layer (CESL). The ILD layer 116 could be formed on the substrate 102 to cover the MOS transistor 108, and a plurality of contact plugs 118 could be formed in the ILD layer 116 to electrically connect to the gate electrode 112 and/or source/drain region 114 of MOS transistor 108. Since the fabrication of planar or non-planar transistors and ILD layer is well known to those skilled in the art, the details of which are not explained herein for the sake of brevity.

Next, at least a metal interconnect structure is formed on the ILD layer 116 to electrically connect the contact plugs 118, in which the metal interconnect structure could include an inter-metal dielectric (IMD) layer 120 disposed on the ILD layer 116, metal interconnections 122 embedded in the IMD layer 120 on the first region 104 and the second region 106, an IMD layer 124 disposed on the IMD layer 120, metal interconnections 126 such as via conductors embedded in the IMD layer 124, an IMD layer 128 disposed on the IMD layer 124, and metal interconnections 130 embedded in the IMD layer 128. Preferably, the metal interconnections 122 made of trench conductors could be referred as first level metal interconnections and the metal interconnections 130 also made of trench conductors could be referred to as second level metal interconnections.

Similar to the aforementioned embodiment, each of the metal interconnections 122, 126, 130 could be embedded within the IMD layers 120, 124, 128 according to a single damascene process or dual damascene process. For instance, each of the metal interconnections 122, 126, 130 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. Moreover, the metal layer within the metal interconnections 122, 126, 130 preferably includes copper and the IMD layers 120, 12,4, 128 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH).

Next, a FeFET 132 is formed on the IMD layer 128 on the first region 104. In this embodiment, the formation of the FeFET 132 could be accomplished by first forming a semiconductor layer on the surface of the IMD layer 128, performing an anneal process such as a nanosecond laser anneal (NS-LSA) process on the semiconductor layer, and then conducting a photo-etching process to remove part of the semiconductor layer for forming a patterned semiconductor layer 134 and a patterned semiconductor layer 136 on the surface of the IMD layer 128 on the first region 104 and second region 106 respectively. Preferably, the patterned semiconductor layer 134 on the first region 104 is serving as a substrate for the FeFET 132 while the patterned semiconductor layer 136 on the second region 106 is serving as a substrate for a FeRAM formed in the later process. Similar to the aforementioned embodiment, the semiconductor layers 134, 136 could be selected from the group consisting of silicon (Si), germanium (Ge), Si—Ge compounds, silicon carbide (SiC), and gallium arsenide (GaAs).

Next, another photo-etching process is conducted to remove part of the semiconductor layer 136 on the second region 106 for forming a trench (not shown), and then at least a conductive material is deposited into the trench for forming a metal interconnection 138 or via conductor, in which the metal interconnection 138 preferably connects a bottom electrode of a FeRAM formed afterwards. Preferably, the metal interconnection 138 could be embedded in the IMD layer 136 according to a single damascene or dual damascene process and the metal interconnection 138 directly under the FeRAM preferably includes tungsten.

Next, an interfacial layer 140, a bottom electrode 142, a ferroelectric (FE) layer 144, and a top electrode 146 are formed on the semiconductor layers 134, 136, and a photo-etching process is conducted to remove part of the top electrode 146, part of the FE layer 144, part of the bottom electrode 142, and part of the interfacial layer 140 to form a gate structure 148 made of a patterned interfacial layer 140, a patterned bottom electrode 142, a patterned FE layer 144, and a patterned top electrode 146 on the semiconductor layer 134 on the first region 104.

Similar to the aforementioned embodiment, the interfacial layer 140 includes silicon oxide, and the bottom electrode 142 and top electrode 146 are made of conductive material such as titanium nitride (TiN). The FE layer 144 preferably includes $HfZrO_2$, nevertheless, according to other embodiments of the present invention, the FE layer 50 could also include a material selected from the group consisting of lead zirconate titanate ($bZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate (($BiLa)_4Ti_3O_{12}$, BLT), and barium strontium titanate ($BaSrTiO_3$, BST). Moreover, the interfacial layer 140 includes a thickness of approximately 7 Angstroms, the bottom electrode 142 includes a thickness of approximately 100 Angstroms, the FE layer 144 includes a thickness of approximately 20-50 Angstroms, and the top electrode 146 includes a thickness of approximately 100 Angstroms.

Next, at least a spacer (not shown) is formed on sidewalls of the gate structure 148, a source/drain region 150 and/or epitaxial layer (not shown) are formed in the semiconductor layer 134 adjacent to two sides of the spacer, and selective silicides (not shown) could be formed on the surface of the source/drain region 150 and/or epitaxial layer. In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain region 150 could include n-type dopants or p-type dopants depending on the type of device being fabricated and the epitaxial layers could include silicon germanium (SiGe), silicon carbide (SiC), or silicon phosphide (SiP).

Next, an anneal process 152 such as an ultra-fast laser anneal (UF-LSA) process is conducted on the FE layer 144 of the FeFET 132 for a phase change. Preferably, the anneal process 152 is conducted at a temperature greater than 500° C. and a duration of the anneal process 152 is less than 15 picoseconds.

Next, as shown in FIG. 5, an IMD layer 154 is formed on the FeFET 132 on the first region 104 and the semiconductor layer 136 on the second region 106, at least a metal interconnection 156 such as a via conductor is formed in the IMD layer 154 on the first region 104 to electrically connect the metal interconnection 130 underneath, and a photo-etching process is conducted to remove the IMD layer 154 on the second region 106 and expose the semiconductor layer 136 and even the IMD layer 128 on the second region 106. Similar to the aforementioned embodiment, the metal interconnection 156 could be embedded within the IMD layer 154 according to a single damascene process or dual damascene process. Moreover, the metal interconnection 156 preferably includes tungsten and the IMD layer 154 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH).

Next, a FeRAM 160 is formed on the semiconductor layer 136 and the metal interconnection 138. In this embodiment, the formation of the FeRAM 160 could be accomplished by first forming a bottom electrode 162, a FE layer 164, and a top electrode 166 on the IMD layer 136 and the metal interconnection 138, and then conducting a photo-etching process to remove part of the top electrode 166, part of the FE layer 164, and part of the bottom electrode 162 to form a stack structure 168 made of a patterned bottom electrode 162, a patterned FE layer 164, and a patterned top electrode 166 on the metal interconnection 138.

Similar to the aforementioned embodiment, the bottom electrode 162 and the top electrode 166 are made of conductive material such as titanium nitride (TiN). The FE layer 164 preferably includes $HfZrO_2$, nevertheless, according to other embodiments of the present invention, the FE layer 164 could also include a material selected from the group consisting of lead zirconate titanate ($bZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate (($BiLa)_4Ti_3O_{12}$, BLT), and barium strontium titanate ($BaSrTiO_3$, BST).

Moreover, in this embodiment, the bottom electrode 162 includes a thickness of about 100 Angstroms, the FE layer 164 includes a thickness between 100-120 Angstroms or most preferably at 110 Angstroms, and the top electrode 166 includes a thickness of about 100 Angstroms. It should be noted that the thicknesses of the bottom electrode 162 and top electrode 166 of the FeRAM 160 are substantially equal to the thicknesses of the bottom electrode 142 and top electrode 146 of the aforementioned FeFET 132. For instance, the thickness of each of the four elements is about 100 Angstroms. Nevertheless, the thickness of the FE layer 144 from the FeFET 132 is substantially less than the thickness of the FE layer 164 from the FeRAM 160. According to a preferred embodiment of the present invention, the thickness of the FE layer 164 formed at this stage is about two times or more than the thickness of the FE layer 144. For instance, the thickness of the FE layer 164 could be two times, three times, four times, or more than the thickness of the FE layer 144.

Next, an anneal process 170 such as a rapid thermal anneal (RTP) process could be conducted on the FE layer 164 of the FeRAM 160 for phase change. Preferably, the anneal process 170 is conducted at a temperature equal to or less than 400° C. and a duration of the anneal process 170 is between 25-35 seconds or most preferably at 30 seconds.

It should be noted that in contrast to the FeFET 42 and the FeRAM 74 are disposed on different levels in the aforementioned embodiment, the FeFET 132 and the FeRAM 160 in this embodiment are disposed on the same level. Preferably, the bottom surface of the semiconductor layer 134 serving as a substrate for the FeFET 132 on the first region 104 is even with the bottom surface of the semiconductor layer 136 serving as a substrate for the FeRAM 160 on the second region 106, and at the same time the bottom surface of the gate structure or interfacial layer 140 of the FeFET 132 is also even with the bottom surface of the stack structure 168 or bottom electrode 162 of the FeRAM 160.

Next, as shown in FIG. 6, an IMD layer 172 is formed on the FeFET 132 on the first region 104 and the FeRAM 160 on the second region 106, a plurality of metal interconnections 174 such as via conductors are formed in the IMD layer 172 to electrically connect the top electrode 146 of the FeFET 132, the metal interconnection 156, and top electrode 166 of the FeRAM 160, an IMD layer 176 is formed on the IMD layer 172, and metal interconnections 178 are formed in the IMD layer 176. Preferably, the metal interconnections 174 made of via conductors could also be referred to as third level metal interconnections or third level via conductors and the metal interconnections 178 made of trench conductors could be referred to as fourth level metal interconnections. Similar to the aforementioned embodiment, each of the metal interconnections 174, 178 could be interconnected to each other and embedded within the IMD layers 172, 176 according to a single damascene process or dual damascene process. Moreover, the metal interconnections 174, 178 preferably include copper and the IMD layers 172, 176 could include silicon oxide such as tetraethyl orthosilicate (TEOS) or ultra low-k (ULK) dielectric layers including but not limited to for example porous material or silicon oxycarbide (SiOC) or carbon doped silicon oxide (SiOCH). This completes the fabrication of a semiconductor device according to an embodiment of the present invention.

Overall, the present invention discloses an approach of integrating MOS transistor, FeFET, and FeRAM, in which the integration method could be accomplished by first forming at least a MOS transistor on a substrate, forming an ILD layer on the MOS transistor, conducting a back-end-of-line (BEOL) process or more specifically a metal interconnective process, and then forming FeFET and FeRAM on the ILD layer. According to the aforementioned embodiments, the FeFET and the FeRAM could be disposed on the same level or different level depending on the demand of the process or product. If the FeFET and the FeRAM were disposed on different level, the FeFET is preferably disposed on a semiconductor layer while the FeRAM is disposed on an IMD layer on different level as shown in FIG. 3. Conversely, if the two elements were disposed on the same level, the FeFET and the FeRAM would preferably be disposed on semiconductor layers on the same level as shown in FIG. 6.

Moreover, since the FE layer in the FeFET and the FE layer in the FeRAM typically require different thermal budget during phase change, the FE layer from the FeFET and the FE layer from the FeRAM preferably have different thicknesses. As disclosed in the aforementioned embodiments, the thickness of the FE layer in the FeRAM is preferably two times or more than the thickness of the FE layer in the FeFET and since the FE layers from the two devices require different thicknesses, the FeFET and the FeRAM are preferably fabricated separately whether they're disposed on the same level or different level.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a metal-oxide semiconductor (MOS) transistor on a substrate;
    an interlayer dielectric (ILD) layer on the MOS transistor;
    a first semiconductor layer and a second semiconductor layer on the ILD layer;
    a ferroelectric field effect transistor (FeFET) on the first semiconductor layer, wherein the FeFET comprises a gate structure on the first semiconductor layer and a source/drain region adjacent to the gate structure and in the first semiconductor layer;
    a ferroelectric random access memory (FeRAM) on the second semiconductor layer, wherein the FeRAM and the FeFET are on a same level, a bottom surface of the gate structure is even with a bottom surface of the FeRAM, and top surfaces of the first semiconductor layer and the second semiconductor layer are coplanar; and
    an inter-metal dielectric (IMD) layer on the FeFET and the FeRAM.

2. The semiconductor device of claim 1, wherein the FeFET comprises:
    the gate structure on the first semiconductor layer, wherein the gate structure comprises:
        a first bottom electrode on the first semiconductor layer;
        a first ferroelectric (FE) layer on the first bottom electrode; and
        a first top electrode on the first FE layer; and
    the source/drain region adjacent to the gate structure.

3. The semiconductor device of claim 2, wherein the FeRAM comprises:
    a second bottom electrode on the second semiconductor layer;
    a second FE layer on the second bottom electrode; and
    a second tope electrode on the second FE layer.

4. The semiconductor device of claim 3, wherein a thickness of the first bottom electrode layer is equal to a thickness of the second bottom electrode.

5. The semiconductor device of claim 3, wherein a thickness of the first FE layer is less than a thickness of the second FE layer.

* * * * *